United States Patent [19]
Masaki

[11] Patent Number: 5,296,766
[45] Date of Patent: Mar. 22, 1994

[54] CMOS CIRCUIT WITH CROWBAR LIMITING FUNCTION

[75] Inventor: Yoshifumi Masaki, Nara, Japan

[73] Assignees: Sharp Microelectronics Technology, Inc., Camas, Wash.; Sharp Kabushiki Kaisha, Osaka, Japan

[21] Appl. No.: 894,368

[22] Filed: Jun. 4, 1992

[51] Int. Cl.$^5$ .......................................... H03K 17/687
[52] U.S. Cl. .................................. 307/576; 307/573; 307/451; 307/568
[58] Field of Search ............... 307/448, 451, 452, 576, 307/511, 568

[56] References Cited
U.S. PATENT DOCUMENTS

| | | | |
|---|---|---|---|
| 4,518,873 | 5/1985 | Suzuki et al. | 307/576 |
| 4,874,971 | 10/1989 | Fletcher | 307/576 |
| 4,876,465 | 10/1989 | Podkowa et al. | 307/576 |
| 5,079,439 | 1/1992 | Wanlass | 307/451 |
| 5,165,046 | 11/1992 | Hesson | 307/451 |
| 5,198,699 | 3/1993 | Hashimoto et al. | 307/576 |

*Primary Examiner*—John S. Heyman
*Assistant Examiner*—S. Riley
*Attorney, Agent, or Firm*—Fliesler, Dubb, Meyer & Lovejoy

[57] ABSTRACT

Crowbar current in a CMOS amplifier circuit is limited during a transition state where one transistor is being turned on and another transistor is being turned off. The transistor that is being turned off is caused to pass through a midpoint state before the transistor that is being turned on is allowed to transition through a similar midpoint state. In one embodiment, independent gate voltages are applied to the P and N transistors of a CMOS amplifier. The gate voltages are independently controlled prior to passage through a midpoint level and then converge towards one another after passage through the midpoint state.

20 Claims, 6 Drawing Sheets

FIG. 1A
(PRIOR ART)

CROWBAR PROBLEM

INDUCTIVE LEAD PROBLEM

CMOS CIRCUIT WITH CROWBAR LIMITING FUNCTION

BACKGROUND OF THE INVENTION

1. Field of the Invention

The invention is related generally to complementary metal-oxide-semiconductor CMOS circuits. It is more specifically directed to the design of output buffers in memory chips.

2. Description of the Related Art

CMOS amplifiers are conventionally constructed with a N-channel field effect transistor and a P-channel field effect transistor (FET) connected in series between ground and a positive voltage supply, Vcc. The source of the N-type transistor connects directly or indirectly to ground. The source of the opposing P-type transistor connects directly or indirectly to Vcc. The drains of the two transistors are connected together and their gates are also connected together.

During static operation, a gate voltage, $V_g$, which develops at the gates of the transistors, remains at one or the other of Vcc and ground. This keeps one of the complementary transistors turned off and thereby minimizes the series current flowing from Vcc through the P and N transistors to ground.

During dynamic operation, the gate voltage $V_g$ transitions between Vcc and ground. As it does so, it passes through a range of values where both the N and P transistors are turned on. A relatively high magnitude of current surges through the transistors, passing from Vcc to ground during this time period. The current surge is referred to as "crowbar" current. Crowbar current is undesirable because it drains substantial amounts of energy from the power supply.

The range of gate voltage values where crowbar current flows is referred to as the crowbar region. The conventional method for minimizing power consumption due to crowbar flow is to minimize the amount of time spent by the gate voltage $V_g$ in the crowbar region. But this produces another problem, referred to as the L(di/dt) problem. The slope $dV_g/dt$ of the gate voltage $V_g$ becomes relatively large as time spent in the crowbar region is reduced. Since drain-to-source current, $I_{DS}$, is a function of gate voltage, $V_g$, the rate of change for drain-to-source current $dI_{DS}/dt$ increases as $dV_g/dt$ increases. An undesirable voltage surge, $V = L(dI_{DS}/dt)$ develops along the interconnect leads which couple the CMOS amplifier to the power supply. The surge is in response to the rate of change $dV_g/dt$ at the gates of the CMOS amplifier. L refers to the inductance of the interconnect leads. Interconnect inductance is particularly a problem at circuit portions where on-chip ground or power lines connect by way of relatively long conductors to the ground or power plane of a printed circuit board.

The compromise solution to both the crowbar problem and the Ldi/dt problem has been to minimize the time spent by gate voltage $V_g$ in the crowbar region while limiting the slope $dV_g/dt$ to a predefined maximum value.

There are circumstances, however, where such a compromise solution cannot be used. The design of adjacent circuitry might require the gate voltage $V_g$ to remain within the crowbar region for relatively long periods of time.

One example of this is encountered in the design of high-density static random-access memories (SRAM's) that rely on CMOS technology. Large parasitic capacitances develop either in the bit line structure of the memory device or in an intermediate data bus structure which couples a large number of memory cells to a final output buffer. Data readout time can be undesirably prolonged by the time required for charging and/or discharging the parasitic capacitors. To overcome this problem, the bit line and/or intermediate data bus is pre-charged in between each memory readout, to an amplifier switching point voltage, Vcc/2. This eases the burden placed on the sense amplifiers. The sense amplifiers have input lines coupled to the long bit lines and output lines coupled to the intermediate data bus. When the input and/or output lines are pre-charged to $V_{cc}/2$, less time and/or energy is consumed by the sense amplifiers as they drive the intermediate data bus either to Vcc or ground as individual memory cells are addressed and their states are sensed.

A pre-charge approach of this type is disclosed for example, in a paper by Shinpei Kaayano, et al., entitled "265K×1/64K×4 CMOS SRAM's" IEEE Journal of Solid State Circuits, vol. SC-21, No. 5, Oct. 1986. A bus pre-charge circuit is provided at the input side of the chip's final output amplifiers.

Given the constraint that a switching point voltage, Vcc/2, is forced to appear on a line coupled to the gates of each CMOS output amplifier, the problem then becomes, how to transfer a sensed bit state through a CMOS amplifier in minimal time, while still minimizing crowbar current and the corresponding $dI_{DS}/dt$ rate of change.

SUMMARY OF THE INVENTION

In accordance with the invention, separate gate voltages are applied to the gates of complementary P and N transistors in a CMOS amplifier. The gate voltage of the transistor that is being turned off is made to cross through a midpoint voltage prior to a similar crossing of the midpoint voltage by the gate voltage of the transistor that is being turned on. The midpoint voltage is defined here as the static gate voltage that would have created maximum crowbar current had the gates of the two transistors been tied directly together.

Because midpoint crossing is not concurrent in the respective P and N transistors of the amplifier, a smaller magnitude of crowbar current passes through the amplifier during dynamic operation. Power consumption is less than what would have been consumed if the gate voltages of the two transistors had been allowed to cross through the midpoint voltage concurrently.

A circuit in accordance with the invention includes first and second gate voltage generating means for separately and respectively supplying gate voltages to complementary N and P transistors of a CMOS output buffer. The gate supply means of the N-type output transistor includes crowbar avoidance means which, when activated, pulls the gate voltage of the N-type transistor below a pre-specified midpoint voltage. The gate voltage supply means of the P-type output transistor includes crowbar avoidance means which, when activated, pulls the gate voltage of the P-type transistor above the prespecified midpoint voltage. A reconvergence means is further provided for bringing the gate voltage of the P-type and N-type transistors into convergence at a voltage level that is spaced away from the midpoint voltage.

BRIEF DESCRIPTION OF THE DRAWINGS

The invention will be described with reference to the following figures in which.

DETAILED DESCRIPTION

Figure 1A:
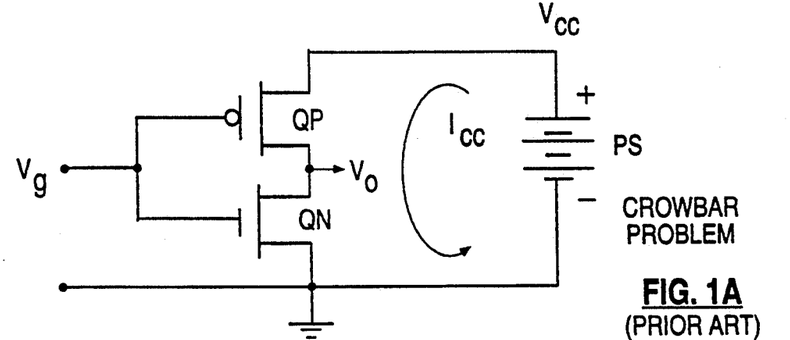
FIG. 1A is a simple schematic illustrating the crowbar problem.

FIG. 1 is provided for illustrating the classic crowbar problem. QN is an N-channel MOSFET (Metal-Oxide-Semiconductor Field Effect Transistor) having its source tied to ground and its gate tied to a supplied gate voltage $V_g$. QP is a P-channel MOSFET having its source connected to the positive terminal +Vcc of a power supply PS and its gate connected to the same gate voltage $V_g$ as that of QN. The negative terminal of the power supply PS connects to ground. $V_g$ is measured relative to ground. The drains of transistors QP and QN are tied together. An output voltage $V_O$ develops at the drain-to-drain connection point. $I_{CC}$ represents the magnitude of current flowing from the positive terminal Vcc of the power supply PS through QP and QN to the negative terminal of the power supply. $I_{CC}$ is referred to as the crowbar current.

Figure 1B:
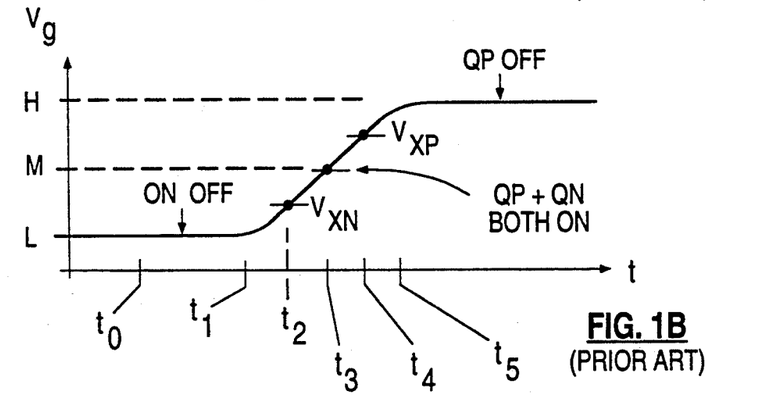
FIG. 1B is a graph of gate voltage versus time, which is used in conjunction with FIG. 1A for explaining the crowbar problem.

FIG. 1B shows a plot of gate voltage $V_g$ against time. $V_{XN}$ represents a threshold gate voltage above which transistor QN is considered to be turned on. $V_{XP}$ represents another gate threshold voltage below which transistor QP is deemed to be turned on. H is a high level gate voltage greater than $V_{XP}$ and $V_{XN}$. L is a low level gate voltage less than $V_{XN}$ and $V_{XP}$. M is a midpoint gate voltage positioned between $V_{XN}$ and $V_{XP}$.

At time point $t_0$, gate voltage $V_g$ is at the low level (L). Transistor QN is considered completely turned off, and accordingly, crowbar current $I_{CC}$ through transistors QP and QN is minimal.

At time point $t_1$, gate voltage $V_g$ begins to increase and its rate of change, $dV_g/d_t$ begins to increase over time as well.

At time point $t_2$, gate voltage $V_g$ crosses the threshold level $V_{XN}$ of transistor QN. Crowbar current $I_{CC}$ begins to increase substantially. This occurs because both of transistors QN and QP are turned on (at varying degrees of conductivity) in the range of $V_{XN} \leq V_g \leq V_{XP}$. Midpoint level M is defined as the gate voltage $V_g$ at which the crowbar current $I_{CC}$ is maximum. It is sometimes referred to as the metastable point or switching point of the CMOS amplifier. The combined drain-to-source resistances, $R_{DSP}$ plus $R_{DSN}$, of respective transistors QP and QN is minimum at the point where $V_g = M$. In many instances, midpoint level M is approximately equal to Vcc/2.

At time point $t_4$, the gate voltage $V_g$ crosses above the threshold $V_{XP}$ of transistor QP. Transistor QP turns off and the crowbar current $I_{CC}$ drops off to a minimal level by time point $t_5$.

Power consumption due to crowbar flow can be minimized by reducing the duration $t_4-t_2$ in which the gate voltage is between respective threshold levels $V_{XP}$ and $V_{XN}$.

Figure 1C:
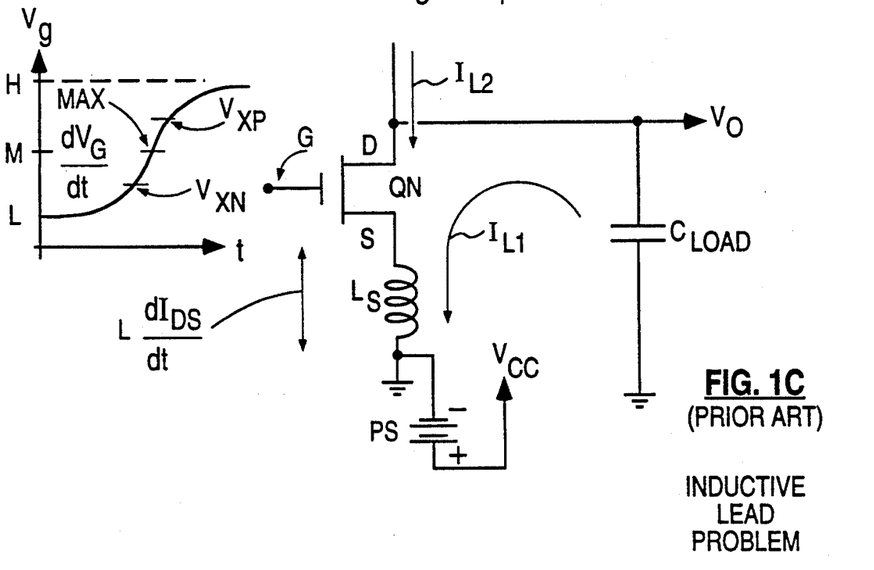
FIG. 1C is a further schematic for explaining the inductive lead problem.

As seen in FIG. 1C, this creates a new problem. At high frequencies, the interconnect wire which couples the source (S) of each transistor (QN and QP, only QN is shown) to the power supply appears as an inductor, $L_S$. The total drain-to-source current, $I_{DS}$, which flows through inductance $L_S$ can include a first component $I_{L1}$ from a discharging load capacitance $C_{LOAD}$ and a second component $I_{L2}$ from the source of the other transistor (QP). Rapid changes in drain-to-source current produces a voltage surge $L(dI_{DS}/dt)$ across the inductance $L_S$. This voltage surge is generally undesirable.

The production of the $L(dI_{DS}/dt)$ voltage surge is associated with the point where the rate of change of the gate voltage, $dV_g/dt$ is maximum. This is because drain-to-source current $I_{DS}$ changes as a function of gate voltage $V_g$. The plot at the left side of FIG. 1C illustrates the point. When $V_g$ switches rapidly between the L and H levels, the point of inflection in its waveform occurs approximately at the midpoint voltage level, M. This is the point where $dV_g/dt$ is usually at its maximum and therefore roughly the point in time where $dI_{DS}/dt$ increases to a maximum.

It is seen from the above-described FIGS. 1A–1C that two undesirable characteristics occur at the crossing of the midpoint level, M. Crowbar current $I_{CC}$ is at its maximum and inductive noise $L(dI_{DS}/dt)$ is also at its maximum.

Figure 2:
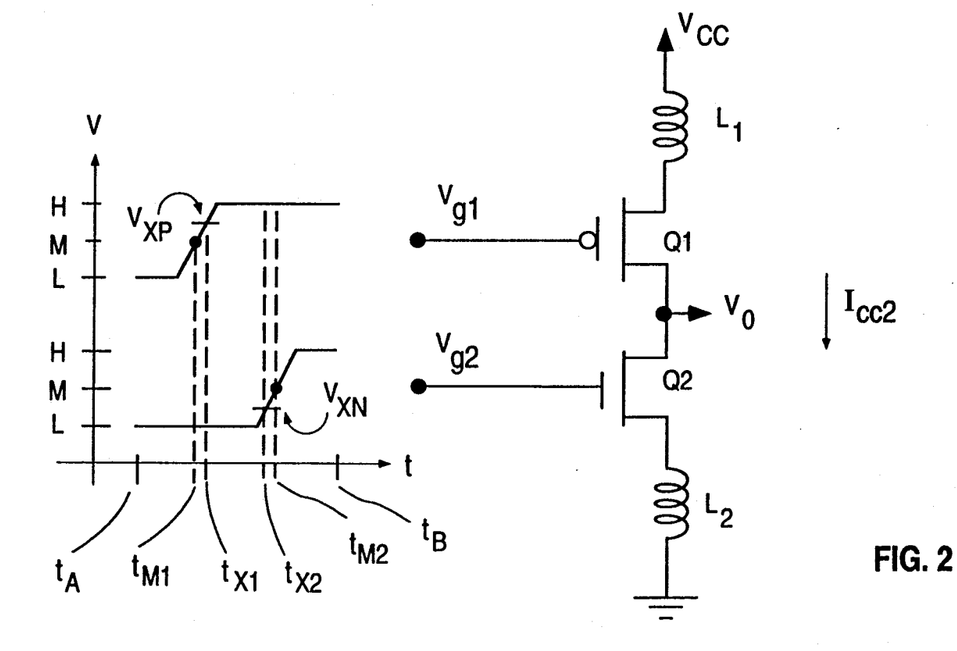
FIG. 2 shows a set of gate voltage versus time graphs and corresponding circuit in accordance with the invention.

FIG. 2 shows how the present invention overcomes these problems. The gate of the P-type transistor (Q1) is separated from the gate of the N-type transistor (Q2). Independent voltage waveforms $V_{g1}$ and $V_{g2}$ are developed at the respective gates of transistors Q1 and Q2.

When the output voltage, $V_O$, is to be driven across the transition region between the high (H) and low (L) levels, the gate voltage of the transistor that is to be turned off is made to cross through the midpoint level, M, first before the gate voltage of the transistor that is being turned on is allowed to cross through the midpoint voltage level, M.

In the illustrated example of FIG. 2, output voltage $V_O$ is to be driven from the high level (H) to the low level (L) between time points $t_A$ and $t_B$. At time point $t_A$, both $V_{g1}$ and $V_{g2}$ are at the low level (L). N-type transistor Q2 is considered to be turned off and P-type transistor Q1 is considered to be turned on (but not conducting a substantial amount of crowbar current $I_{cc2}$ yet). Between time points $t_A$ and $t_{M1}$, first gate voltage $V_{g1}$ rises from the L level to the midpoint level M, while the second gate voltage $V_{g2}$ remains substantially at the low (L) level. Thus, transistor Q2 remains essentially shut off as the first gate voltage $V_{g1}$ crosses the troublesome midpoint level, M.

After first gate voltage $V_{g1}$ has crossed above the midpoint level (M), the second gate voltage $V_{g2}$ crosses through the midpoint level (M) at a later time point $t_{M2}$. The P-type transistor Q1 is further on its way to being shut off by this second time point $t_{M2}$ than it was at first time point $t_{M1}$, and accordingly, a relatively small amount of crowbar current $I_{cc2}$ passes through the series combination of transistors Q1 and Q2.

At time point $t_B$, both the first and second gate voltages, $V_{g1}$ and $V_{g2}$, are at the same high (H) level. Q1 is considered to be turned off and Q2 is considered to be turned on.

The $V_{g1}$ and $V_{g2}$ waveforms shown in FIG. 2 are in one sense, overly idealistic. They would be used if minimal power consumption were the only consideration and circuit response time were not a concern. Event time points are sequentially referenced as $t_A$, $t_{M1}$, $t_{X1}$, $t_{X2}$, $t_{M2}$ and $t_B$. Time $t_A$ is the point where both $V_{g1}$ and $V_{g2}$ are low. Time $t_{M1}$ is the time point where $V_{g1}$ crosses above the midpoint level (M). Time $t_{X1}$ is the point where $V_{g1}$ crosses above threshold level $V_{XP}$. Time $t_{X2}$ is the point where $V_{g2}$ crosses threshold level $V_{XN}$. Time $t_{M2}$ is the point where $V_{g2}$ crosses over midpoint level M and $t_B$ is the time where both $v_{g1}$ and $V_{g2}$ are at the high level (H). Note that $V_{g1}$ crosses above threshold level $V_{XP}$ before $V_{g2}$ crosses above threshold level $V_{XN}$. Q1 turns completely off before Q2 begins to turn on.

In many circuit designs, it is desireable to not only limit power consumption, but also to minimize the time delay between the point where the input signal transition first occurs (at either one of the gates of transistors Q1 and Q2), and the point where the output voltage $V_O$ completes its transition. In such a case, the phase shift between the $V_{g1}$ and $V_{g2}$ waveforms is shortened from that illustrated in FIG. 2. The amount of phase shift between the waveforms should be substantially greater than zero. Its magnitude can vary, however, depending on conditions. $V_{g2}$ can cross above $V_{XN}$ before $V_{g1}$ crosses above $V_{XP}$. However, $V_{g2}$ should cross above the troublesome midpoint level (M) only after $V_{g1}$ has crossed above the midpoint level (M).

It is to be understood that in the case where the transition of output voltage $V_O$ is the other way, from low (L) to high (H), transistor Q2 becomes the transistor which is being turned off and its gate voltage, $V_{g2}$, should be the one that crosses downwardly through the midpoint level (M) before $V_{g1}$ crosses downwardly through the midpoint level (M).

Figure 3A:
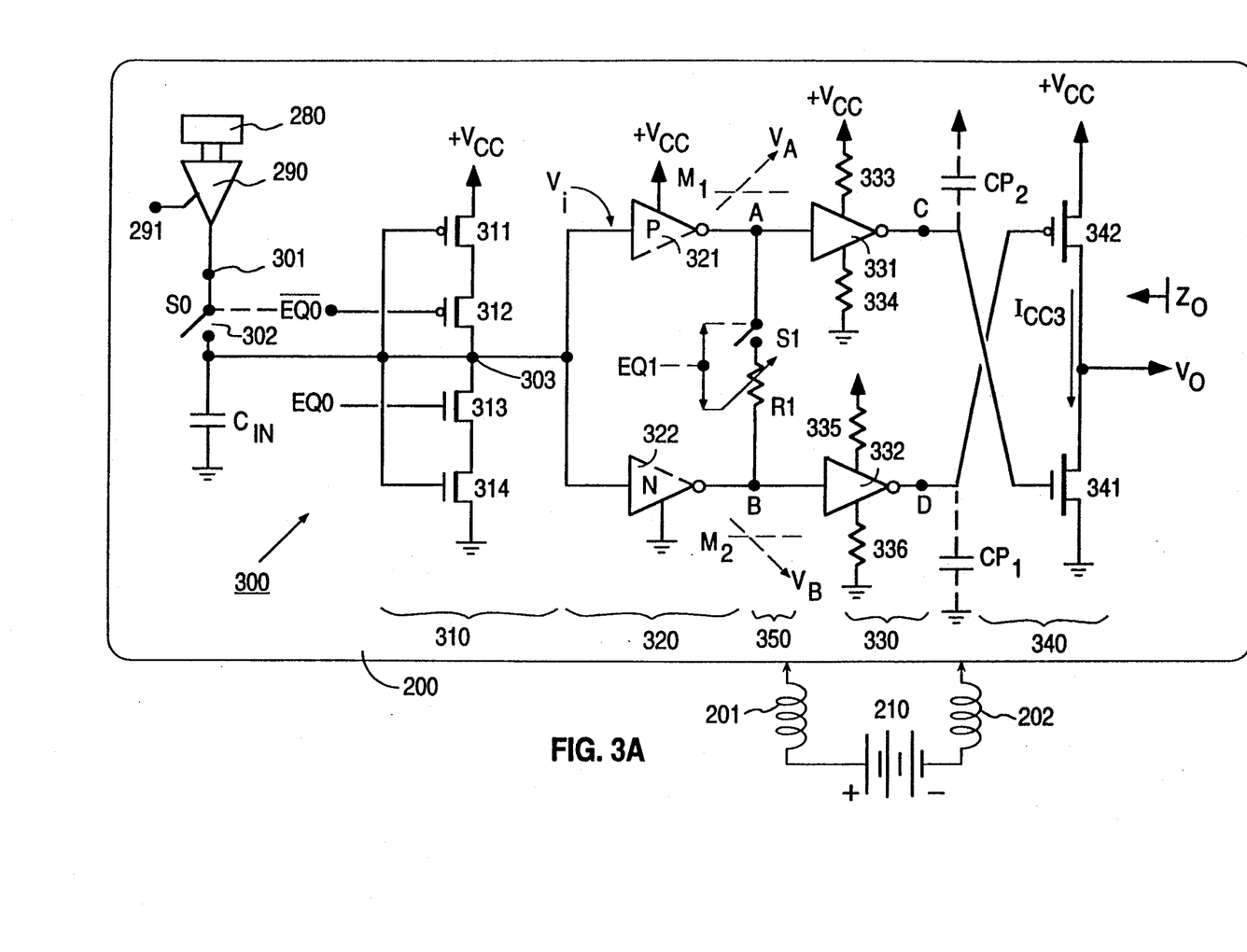
FIG. 3A is a schematic diagram showing a circuit in accordance with the invention.

FIG. 3A is a schematic of a circuit 300 in accordance with the invention. Circuit 300 forms part of an integrated circuit (IC) chip 200. The IC chip 200 has ground and Vcc rails which connect to an off-chip power supply 210 by way of inductive leads 201 and 202. Circuit 300 includes an equalizer section 310, a midpoint-avoiding section 320, a rate control section 330, an output section 340 and a re-converge section 350.

Equalizer section 310 receives input signals from an input node 301 by way of an input line 303. The input line 303 is characterized as having a relatively high parasitic capacitance $C_{in}$. Input node 301 is driven by a relatively weak, on-chip signal source 290. The signal source 290 can be a tri-state driver which has a control terminal 291 for placing it into a high impedance output state. Alternatively, the signal source can be of the two state variety. In the latter case, a disconnect switch (S0) 302 is provided for temporarily decoupling the output of source 290 from input line 303. In the former case, the S0 switch can be removed from the circuit and its function can be replicated by switching the signal source 290 between the high impedance and active output states. In one embodiment, block 280 represents an on-chip memory cell and signal source 290 is a differential sense amplifier having plural input terminals coupled to the memory cell 280 for sensing the state of the memory cell.

Parasitic capacitance $C_{in}$ is initially charged to a voltage close to power supply level Vcc or discharged to a level close to ground. The voltage across capacitance $C_{in}$ is referenced as input voltage $V_i$. Signal source 290 is too weak to completely reverse the charge across parasitic capacitance $C_{in}$ within a time period called for by a predefined circuit specification. Equalizer section 310 is provided for pre-charging parasitic capacitance $C_{in}$ to a midpoint voltage $M_0$ prior to the closing of the disconnect switch (S0) 302. When disconnect switch 302 closes, the weak signal source 290 begins to either charge the parasitic capacitance $C_{in}$ and move voltage $V_i$ from midpoint $M_0$ to Vcc or discharge capacitance $C_{in}$ and move its voltage $V_i$ from midpoint $M_0$ to ground. If equalizer section 310 were not included, signal source 290 might have to modulate the voltage across capacitance $C_{in}$ by the full voltage swing, Vcc, and this might consume excess time.

Equalizer section 310 includes two P-type transistors 311, 312 and two N-type transistors 313 and 314, coupled in series from the Vcc power rail to ground in the recited order, as shown. The gates of transistors 311 and 314 are coupled to the input line 303. The gate of transistor 312 is coupled to receive an inverted equalization control signal, $\overline{EQ0}$. The gate of transistor 313 is coupled to receive the noninverted version of the equalization control signal, EQ0.

At the beginning of a pre-charge operation, switch 302 is open, equalization control signal EQ0 goes high (H) to thereby turn N-type transistor 313 on, and the inverted equalization control signal $\overline{EQ0}$ goes low (L) to simultaneously turn on P-type transistor 312. A voltage-divider network is thus formed to charge or discharge the parasitic capacitance $C_{in}$ to a predefined midpoint voltage level $M_0$. In many cases, $M_0$ is approximately equal to Vcc/2. Transistors 313-314 are appropriately sized for generating the input midpoint voltage level, $M_0$.

The midpoint-avoiding section 320 includes a positive biasing circuit 321 and a negative biasing circuit 322 each having an input coupled to input line 303. The output of positive-biasing circuit 321 is referenced as node A. The output of negative-biasing circuit 322 is referenced as node B. The voltages developed at nodes A and B are respectively denoted as $V_A$ and $V_B$.

Positive-biasing circuit 321 becomes activated when input voltage $V_i$ moves below a pre-specified threshold voltage $V_{XP1}$. When activated, the positive-biasing circuit 321 urges the voltage $V_A$ at node A to a point above a predefined first midpoint level, $M_1$.

Similarly, negative-biasing circuit 322 is activated when the input voltage $V_i$ shifts above a pre-specified second threshold voltage $V_{XN2}$. When activated, negative-biasing circuit 322 urges the voltage $V_B$ at node B downwardly below a predefined second midpoint level, $M_2$.

$M_1$ is a switching point voltage associated with a subsequent amplifier-transistor combination 331-341. $M_2$ is a switching point voltage associated with a subsequent amplifier-transistor combination 332-342. $M_0$ is a switching point voltage associated with biasing circuits 321 and 322. In one embodiment, $M_0 = M_1 = M_2$ and moreover they are all approximately equal to Vcc/2.

Reconvergence section 350 includes a switch, S1, and variable resistor, R1, connected in series between node A and node B. A re-convergence control signal EQ1 controls the operations of both switch S1 and resistor R1. Switch S1 is open and variable resistor R1 is at maximum resistance when control signal EQ1 is at the logic low (L) voltage level. In such a case, the voltage $V_A$ at node A develops independently of the voltage $V_B$ at node B.

When reconvergence control signal EQ1 transitions from the logic low (L) level to the logic high (H) voltage level, switch S1 closes and the resistance of variable resistor R1 gradually decreases from a maximum value to a minimum value. As this occurs, node voltages $V_A$ and $V_B$ gradually converge towards equality with one another.

Rate control section 330 includes two CMOS amplifiers 331 and 332. The input of amplifier 331 connects to node A. An inverting output of amplifier 331 connects to node C. A first implant-defined resistor 333 connects the positive power terminal of amplifier 331 to the on-chip voltage rail Vcc. A second implant-defined resistor 334 couples the ground terminal of amplifier 331 to the on-chip ground rail. (An implant-defined resistor is one that is formed by introducing limited amounts of dopants into the semiconductor substrate. Means other than implanted resistors can of course be used to provide current limitation.)

Similarly, the input of amplifier 332 connects to node B. An inverting output of amplifier 332 connects the node D. An implant-defined resistor 335 connects the positive power terminal of amplifier 332 to the on-chip Vcc power rail. Another implant-defined resistor 336 connects the ground terminal of amplifier 332 to the on-chip ground rail.

Node C connects to the gate of N-channel output transistor 341. The gate of transistor 341 has a parasitic capacitor $CP_1$ associated therewith.

Node D connects to the gate of P-channel output transistor 342. The gate of transistor 342 has another parasitic capacitance $CP_2$ associated therewith.

The drains of transistors 341 and 342 are connected together at a node which develops output voltage $V_O$. The source of N transistor 341 connects to the on-chip ground rail. The source of P transistor 342 connects to the on-chip Vcc rail.

Resistors 333 and 334 are selected to limit the respective charge and discharge rates of first parasitic capacitance $CP_1$ to predefined limits so as to control the L(di/dt) voltages developed across inductive leads 201 and 202. Similarly, resistors 335 and 336 are selected to limit the respective discharge and charge rates of parasitic capacitance $CP_2$ for the same reason.

Circuit 300 has three basic operating phases: phase-1, phase-2 and phase-3. In phase-1, switch S0 is open, switch S1 is open, at least one of transistors 341 and 342 is turned off, and the equalization control signal EQ0 is switched high (H). In phase-2, equalization control signal EQ0 switches low (L). Switch S1 remains open. Switch S0 closes and signal source 290 begins to drive the voltage $V_i$ of line 303 away from the equalization midpoint level, $M_0$. As it does so, one of biasing circuits 321 and 322, correspondingly drives its node voltage, $V_A$ or $V_B$, away from its respective midpoint level, $M_1$ or $M_2$. Phase-3 begins thereafter. Switch S0 remains closed. Switch S1 closes and resistance R1 decreases monotonically from a maximum value to a minimum value. Node voltages $V_A$ and $V_B$ then converge towards each other. Of importance, the $V_A$-to-$V_B$ convergence point is at a voltage which is spaced substantially away from one of midpoint levels, $M_1$ or $M_2$. Crowbar current $I_{cc3}$ through transistors 341 and 342 is therefore reduced below the maximum level that would have been attained if node A had been shorted directly to node B.

Even though crowbar current $I_{cc3}$ is so limited, It is to be understood that other crowbar currents flow through the series circuit formed by transistors 311-314, through amplifiers 331 and 332 and through switch S1 when it is closed. The sum of these other crowbar currents is often much smaller in magnitude than the maximum crowbar current which would have flowed through transistors 341 and 342 if node A had been shorted to node B, and thus there is an overall saving in total current consumption and power consumption.

Figure 3B:
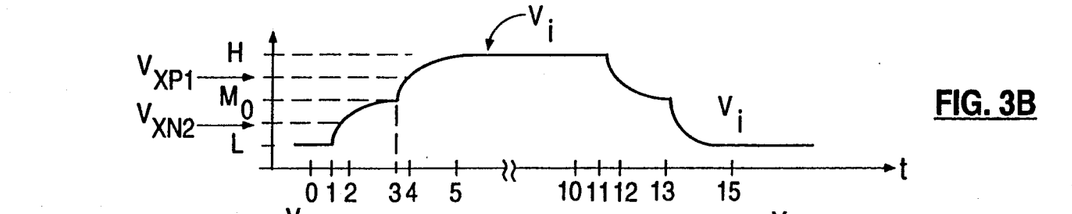
FIGS. 3B–3E are voltage versus time graphs showing the relationship between voltages at various nodes of FIG. 3A.
Figure 3C:
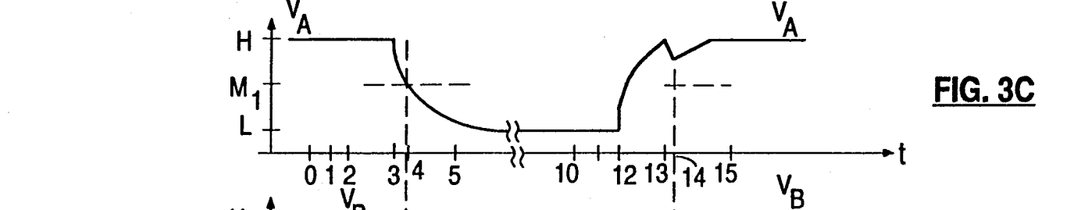
Figure 3D:
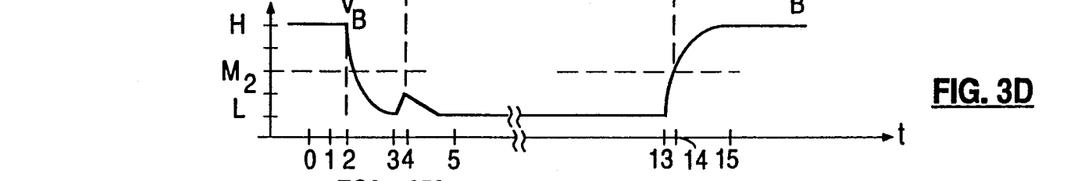
Figure 3E:
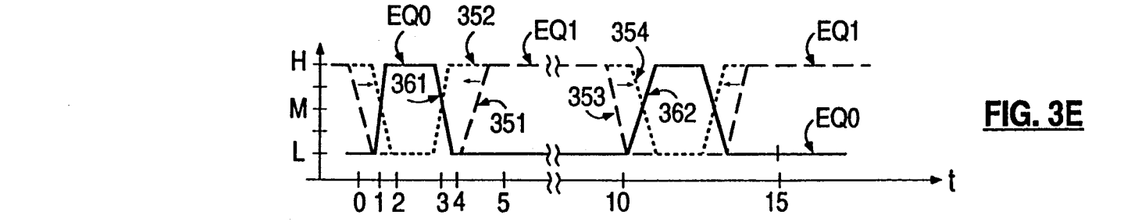

FIGS. 3B–3E are voltage versus time plots showing the waveforms of respective voltage signals, $V_i$, $V_A$, $V_B$ and EQ0. FIG. 3E also shows the waveform for the re-convergence control signal EQ1.

At time point $t=0$, switch S0 is closed, switch S1 is closed, variable resistance R1 is at its minimum, $V_i = L$, $V_A = H$ and $V_B = H$.

Between time points $t=0$ and $t=1$, switch S0 opens to thereby free line 303 for pre-charging. Resistance R1 increases to its maximum value and switch S1 opens to thereby separate nodes A and B and allow each to develop its own independent voltage.

At time point $t=1$, equalizer control signal EQ0 switches from low (L) to (H) and equalizer section 310 begins to charge the parasitic capacitance Cin towards midpoint voltage $M_0$.

The result of this activity is shown in FIG. 3B between time points $t=1$ and $t=3$. Input line voltage $V_i$ follows an RC charge curve which takes it from the L level to the $M_0$ midpoint level.

At time point $t=2$, line voltage $V_i$ crosses threshold level $V_{XN2}$. This activates the negative-biasing circuit 322. Node voltage $V_B$ is pulled below the $M_2$ midpoint level, as seen in FIG. 3D. Node voltage $V_A$ (FIG. 3C) remains unaffected and stays at its initial high level (H).

At time point $t=3$, line voltage $V_i$ reaches the $M_0$ midpoint level. As it does so, the EQ0 control signal begins to go low, thereby deactivating the equalizer section 310. At approximately the same time, $t=3$, the input disconnect switch S0 closes and couples the output of source 290 to line 303. (Switch S0 can be controlled by the inverted $\overline{EQ0}$ signal, as indicated by the dashed line connecting $\overline{EQ0}$ to switch S0 in FIG. 3A.)

It will be assumed here that the signal source 290 begins to drive line 303 from the $M_0$ midpoint level to the high level, H, during time period $t=3$ to $t=5$.

At time point $t=3$ or more preferably, shortly thereafter at time point $t=4$, node-separating switch S1 closes and variable resistance R1 begins to transition from a maximum resistance state to a minimum resistance state. Node voltage $V_A$ begins to drop at this time, $t=3$ through $t=4$, because the node-separating switch S1 is now closed and equalization current flows through the S1 and R1 series circuit from node A to node B. $V_A$ begins to converge towards $V_B$ and vice versa as resistance R1 decreases. The voltage $V_B$ at node B may be temporarily pulled high by the closure of switch S1, but negative-biasing circuit 322 is made sufficiently strong and/or resistance R1 is held sufficiently high at the time of closure to prevent voltage $V_B$ from rising close to the midpoint level $M_2$ as positive charge from node A passes through resistor R1 to node B.

At time point t=4, or shortly thereafter, voltage $V_A$ crosses downwardly through its corresponding midpoint level $M_1$ while voltage $V_B$ is held substantially below its corresponding midpoint level $M_2$. As resistance R1 continues to decrease, node voltages $V_A$ and $V_B$ equalize with one another, and at time point t=5, it is seen that they have both dropped to the low level (L).

A mirror image operation takes place between time period t=10 and t=15. Line voltage $V_i$ descends from the high level (H) to the low level (L) with the equalizer section 310 carrying it downwardly to midpoint level $M_0$. At time point t=12, $V_i$ crosses below threshold level $V_{XP1}$, thereby activating positive-biasing circuit 321. Node voltage $V_A$ is pulled above its midpoint level, $M_1$ before node voltage $V_B$ crosses through its corresponding midpoint level $M_2$.

Referring to FIG. 3E, the falling edge 361 of equalization control signal EQ0 preferably falls close to the low (L) voltage level before the rising edge 351 of the EQ1 reconvergence control signal begins to rise. If faster response time is desired, however, the rising edge of the EQ1 signal can be pulled back as far as position 352.

Similarly, the falling edge 353 of the EQ1 reconvergence control signal should drop substantially to the low (L) voltage level before the rising edge 362 of the EQ0 signal begins. If faster response time is desired, the phase difference between the EQ0 and EQ1 signals can be reduced to that indicated by alternative falling edge 354 of the EQ1 signal.

The phase shift between trailing/rising edges 361 and 351 or 353 and 362 can be independently controlled by way of well known phase-shifting techniques. Numerous clock-signal generating circuits are available for producing the desired timing relationships between the rising and falling edges of control signals EQ0 and EQ1.

Figure 4:
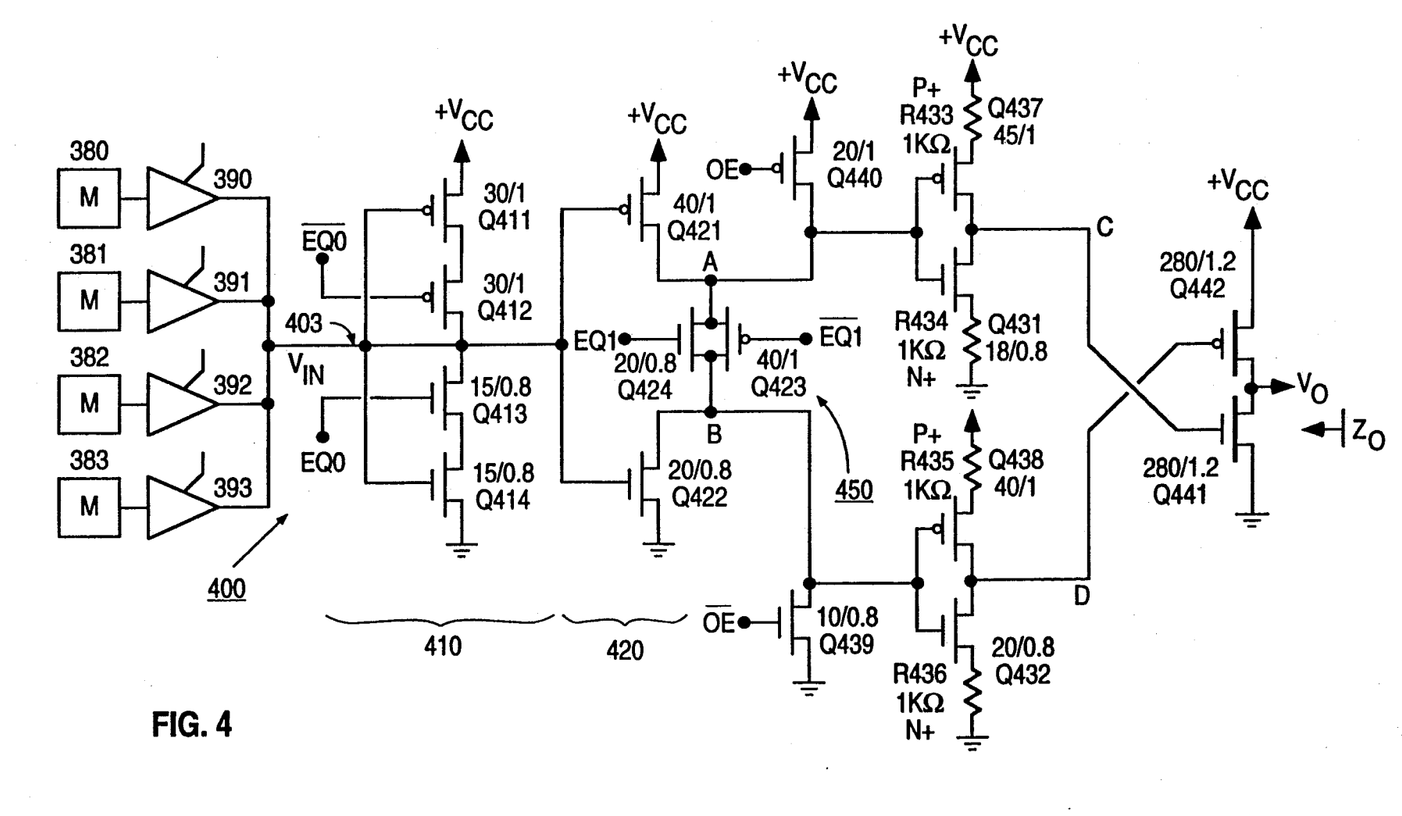
FIG. 4 is a transistor level schematic of a circuit in accordance with the invention.

FIG. 4 shows a transistor-level implementation 400 of the circuit shown in FIG. 3A. It is to be understood that numerous other implementations are possible. Like reference numbers are used in FIG. 4 for elements which correspond to those already described in FIG. 3A.

Items 380-383 represent on-chip memory cells. Items 390-393 represent corresponding tri-state sense amplifiers each having an input coupled to a respective one of memory cells 380-383 and an output coupled to common line 403.

Transistors Q411-Q414 define equalization section 410. Transistor dimensions are given in microns as channel width over channel length. In the instant case, transistors Q411-Q414 are sized to precharge input line 403 to Vcc/2.

Crowbar-region avoiding circuit 420 is composed of P-channel transistor Q421 and N-channel transistor Q422. Transistor Q421 pulls node A towards +Vcc when activated. Transistor Q422 pulls node B towards ground when activated.

Reconvergence circuit 450 is defined by a CMOS transmission gate. The transmission gate comprises N-channel transistor Q424 and P-channel transistor Q423. Non-inverted control signal EQ1 is applied to the gate of N transistor Q424. An inverted version, $\overline{EQ1}$ is applied to the gate of P transistor Q423.

Transistors Q431 and Q437 define the rate-limited amplifier which drives the gate of output transistor Q441. The width/length dimensions of Q441 are 280/1.0. A one kilo-ohm (1K) P+implant resistor R433 is interposed between the source of P transistor Q437 and the Vcc power rail. Another one kilo-ohm (1K) N+ implant resistor, R434, is interposed between the source of N transistor Q431 and ground. P-channel transistor Q440 serves as an output enable/disable control element. When the OE control signal applied to the gate of Q440 goes high (H), transistor Q440 is turned off. When the OE control signal goes low (L), Q440 turns on and operates by way of amplifier Q431/Q437 to turn off the N-channel output transistor, Q441.

In similar fashion, transistors Q432, Q438 and resistors R435, R436 define the rate-limited CMOS amplifier which drives the gate of the P-channel output transistor Q442. The width/length dimensions of Q442 are 280/1.2 in microns. N-channel transistor Q439 functions as the output enable/disable control element for output transistor Q442. The inverted control signal $\overline{OE}$ is applied to the gate of transistor Q439. The drain of Q439 connects to the gates of Q432 and Q438.

The preferred timing and waveform of the EQ1 control signal will vary with circumstances. Generally speaking, EQ1 is controlled to conform with the waveform of the $V_i$ input signal, the threshold characteristics of devices within the circuit, mass-production process variations, and the response time desired of the circuit.

Figure 5:
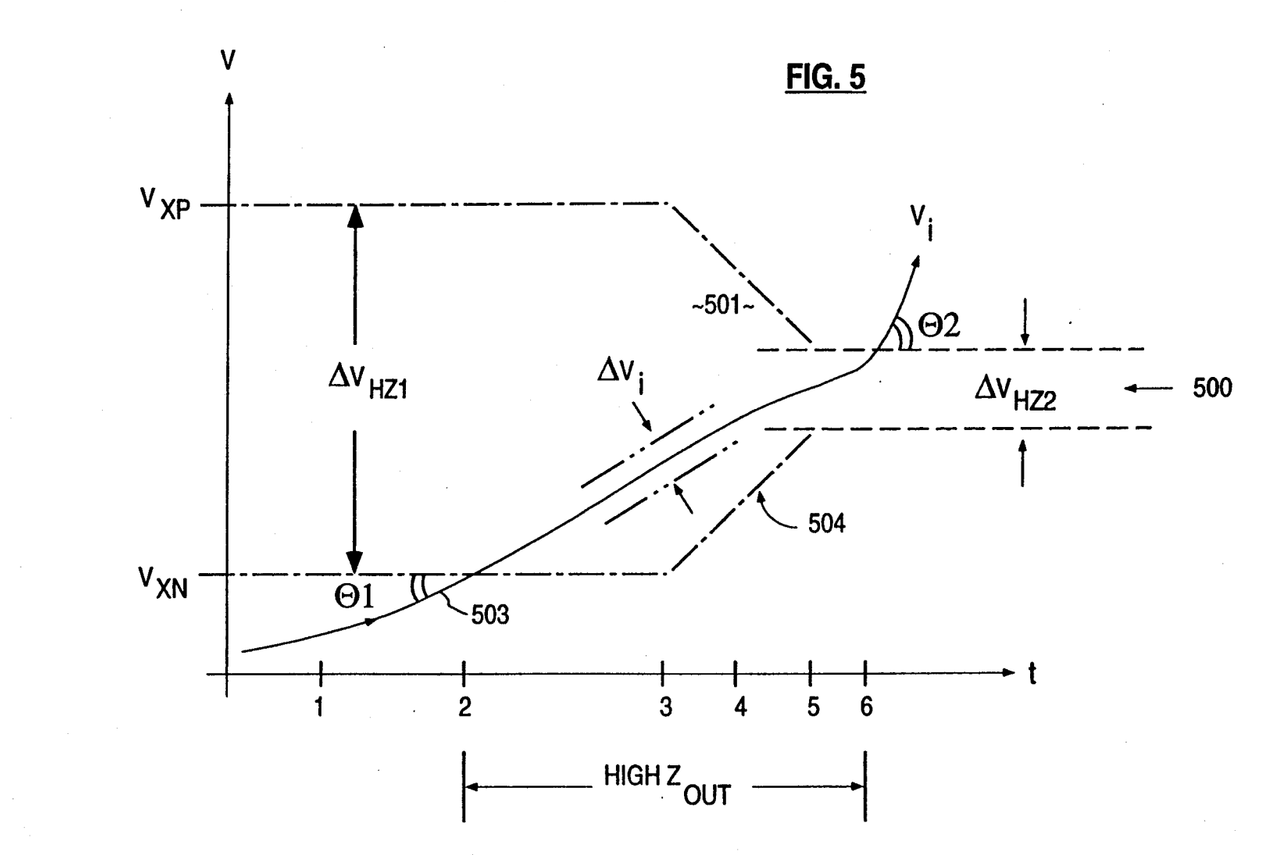
FIG. 5 is a voltage versus time plot used for explaining various considerations to be taken in the operation of the circuits shown in FIGS. 3A and 4.

FIG. 5 provides a voltage versus time plot for explaining the various factors involved. Solid curve 503 represents the input voltage $V_i$ appearing over time on input line 303 of FIG. 3A (or line 403 of FIG. 4). The illustrated waveform is merely an example used here for explanation purposes. Other waveforms are possible. The actual waveform of the $V_i$ signal will vary depending on characteristics of the input line 303 (or 403), the line-driving circuits 290 (or 390-393) and the signals supplied to the line-driving circuits.

The $V_i$ waveform 503 shown in FIG. 5 increases monotonically from a first voltage level located below a first switching level, $V_{XN}$, moves into and through a first voltage zone labeled as $\Delta V_{HZ1}$ and moves directly from there into and upwardly out of a second voltage zone labeled $\Delta V_{HZ2}$.

The area located within either the relatively wide, first voltage zone, $\Delta V_{HZ1}$, or the relatively narrow, second voltage zone, $\Delta V_{HZ2}$, or the funnel-shaped zone 501 which connects them, is referred to collectively as the high output impedance zone 500 (for reasons that will be presented shortly).

While not shown, it is to be understood that the discussion below is also intended to cover a second, opposing case where the $V_i$ waveform decreases monotonically from a second voltage level located above a second switching level, $V_{XP}$, moves into and through the first voltage zone, $\Delta V_{HZ1}$, and moves directly from there into and downwardly out of the second voltage zone, $\Delta V_{HZ2}$. In other words, $V_i$ enters zone 500 in the second case from the top of first voltage zone $\Delta V_{HZ1}$ and leaves zone 500 from the bottom of second voltage zone $\Delta V_{HZ2}$.

The discussion below is also intended to cover a third case where the $V_i$ waveform starts off increasing monotonically from below the first switching level, $V_{XN}$, moves into and through the first voltage zone, $\Delta V_{HZ1}$, and moves immediately thereafter into the second voltage zone, $\Delta V_{HZ2}$, but once there, turns downwardly to cross out of the bottom of the second voltage zone, $\Delta V_{HZ2}$. In other words, $V_i$ enters zone 500 in the third case from the bottom of first voltage zone $\Delta V_{HZ1}$ and leaves zone 500 from the bottom of second voltage zone $\Delta V_{HZ2}$.

The discussion below is also intended to cover a fourth case where the $V_i$ waveform starts off decreasing monotonically from above the second switching level, $V_{XP}$, moves into and through the first voltage zone, $\Delta V_{HZ1}$, and moves immediately thereafter into the second voltage zone, $\Delta V_{HZ2}$, but once there, turns upwardly to cross out of the top of the second voltage zone, $\Delta V_{HZ2}$. In other words, $V_i$ enters zone 500 in the fourth case from the top of first voltage zone $\Delta V_{HZ1}$ and leaves zone 500 from the top of second voltage zone $\Delta V_{HZ2}$.

As long as input voltage $V_i$ remains within the high output impedance zone 500, the output impedance $Z_O$ that is seen looking into the output (the drains) of transistors 341 and 342 (or Q441 and Q442), remains relatively high. If input voltage $V_i$ shifts outside the high impedance voltage zone 500, output impedance $Z_O$ becomes relatively small. The boundaries of zone 500 represent circuit threshold levels, and as seen, these levels change over time.

The dash-dot curve 504 which begins at the bottom of the $\Delta V_{HZ1}$ zone, slopes upwardly along the bottom of zone 501 to connect the bottom of the $\Delta V_{HZ1}$ zone to the bottom of the $\Delta V_{HZ2}$ zone, and continues rightwardly along the bottom of the $\Delta V_{HZ2}$ zone, essentially represents the EQ1 waveform, but not to scale.

Just before timepoint $t=3$, the EQ1 control signal is at logic low (L), switch S1 is open (FIG. 3A), and node-coupling resistance R1 is at its maximum resistance value. Between timepoints $t=3$ and $t=5$, the EQ1 signal transitions from the logic low level (L) to the logic high level (H). Switch S1 closes and resistor R1 decreases in resistance from its maximum resistance level to its minimum level. Dash-dot curve 504 correspondingly transitions from the bottom of the $\Delta V_{HZ1}$ zone to the bottom of the $\Delta V_{HZ2}$ zone. After timepoint $t=5$, the EQ1 signal remains at the logic high (H) level. Switch S1 correspondingly remains closed and resistor R1 remains at its minimum resistance level.

The EQ1 control signal is preferably controlled such that the dash-dot curve 504 essentially tracks the path of the adjacent $V_i$ curve 503 while assuring that the $V_i$ curve 503 remains within the high impedance voltage zone 500 between timepoints $t=3$ and $t=5$. The $V_i$ waveform 503 exits the high impedance voltage zone 500 a short time later, at timepoint $t=6$.

Before input voltage $V_i$ crosses upwardly into the $\Delta V_{HZ1}$ zone as shown in FIG. 5 (before timepoint $t=2$), output impedance $Z_O$ is relatively small. This is so even if switch S1 is already driven into the open circuit position. When switch S1 is driven open, it decouples positive-biasing circuit 321 from the gate of the P-output transistor 342. Biasing circuit 321 is then blocked from driving transistor 342 into the conductive state. Transistor 342 may remain turned on, however, because of charge retained in its parasitic gate capacitance $CP_2$.

Output impedance $Z_O$ begins to grow large as a result of input voltage $V_i$ crossing threshold level $V_{XN}$. The crossing activates negative-biasing unit 322 and this in turn initiates the turning-off of P-transistor 342. The angle 81 at which the $V_i$ waveform 503 crosses the $V_{XN}$ threshold determines the rate at which the P-transistor 342 will begin to shut off and the rate $di/dt$ at which the load current through transistor 342 decreases. Generally speaking, it is preferable to keep angle $\theta 1$ relatively small in order to minimize the $L \cdot di/dt$ surge across inductive power leads of the overall circuit.

Between timepoints $t=2$ and $t=6$, while $V_i$ is within the high output impedance zone 500, one of transistors 341 and 342 is being turned off while the other of these transistors is not yet being turned on. Crowbar current $I_{CC3}$ is kept at a minimum at this time.

The vertical width of high output impedance zone 500 is essentially a function of the resistance of variable resistor R1. While resistance R1 is at its maximum, the width of zone 500 extends as indicated by $\Delta V_{HZ1}$ from the threshold level, $V_{XN}$, of the negative-biasing unit 322 (or Q422) to the threshold level, $V_{XP}$, of the positive-biasing unit 321 (or Q421). As resistance R1 decreases over the duration $t=3$ to $t=5$, the width of zone 500 decreases, as indicated by funnel-shaped region 501, until the minimum width of zone 500 is reached, as indicated by $\Delta V_{HZ2}$.

If fast response time is desired, it is advantageous to have input voltage $V_i$ leave the high output impedance zone 500 as soon after it enters the $\Delta V_{HZ2}$ zone as practical. When input voltage $V_i$ exits zone 500 at timepoint $t=6$, its waveform 503 should break away from the top (or bottom) of zone 500 at a relatively large angle $\theta_2$. As $V_i$ exits sharply from $\beta$ the top of zone 500, positive-biasing circuit 321 is rapidly de-activated, negative-biasing circuit 322 drives nodes A and B low, amplifier 331 drives node C high, and transistor 341 begins to turn on rapidly. Conversely, for cases not shown where $V_i$ exits sharply from the bottom of zone 500, negative-biasing circuit 322 is rapidly de-activated, positive-biasing circuit 321 drives nodes A and B high, amplifier 332 drives node C low, and transistor 342 begins to turn on rapidly.

It is preferable to complete the transition of resistance R1 from its maximum level to its minimum level just before the $V_i$ waveform 503 exits out of the high impedance zone 500. This helps to reduce the overall response time of the amplifier.

For the same reason, it is preferable to begin the transition 504 of resistance R1 from its maximum level to its minimum level just after the $V_i$ waveform 503 enters into the high impedance zone 500. A problem is encountered, however, in the mass production of amplifier units. A certain degree of uncertainty exists with regard to the exact path which input voltage $V_i$ will follow in a specific mass-produced unit as $V_i$ transitions between the logic low (L) and logic high (H) levels. This uncertainty is indicated by the dash-double-dot lines labeled $\Delta V_i$ in FIG. 5. Some degree of tolerance is preferably provided in timing the closing of switch S1 and reduction of resistance R1 to compensate for the uncertainties of the input voltage waveform 503. Some timing leeway is provided for assuring that input voltage $V_i$ is substantially within second zone $\Delta V_{HZ2}$ before the high-to-low resistance transition 504 of resistor R1 completes. Otherwise zone 500 might collapse too quickly to its minimum width before input voltage $V_i$ has a chance to enter into the narrow $\Delta V_{HZ2}$ zone. Premature collapse can produce undesired crowbar currents.

Trade-offs between acceptable tolerances and acceptable output response times will vary from case to case. It is to be understood that FIG. 5 merely illustrates the factors to be considered in deciding when to begin the transition of the EQ1 signal from logic low (L) to logic high (H) and how quickly the transition should take place. The circuit designer has to consider all factors before deciding what trade offs are to be made in a specific circuit design.

The above disclosure is to be taken as illustrative of the invention rather than as limiting its scope or spirit. Numerous modifications and variations will become apparent to those skilled in the art after studying the above disclosure. Given the above disclosure of general concepts and specific embodiments, it is to be understood that the scope of protection sought here is to be defined by the claims appended hereto.

What is claimed is:

1. A crowbar-limited CMOS circuit comprising:
   a signal input node for receiving an input signal, said input signal switching between predefined low and high input levels;
   a transition control node for receiving a reconvergence control signal, said reconvergence control signal switching between opposed first and second states;
   a N-type first transistor having respective first gate, source and drain terminals;
   a P-type second transistor having respective second gate, source and drain terminals, where the second drain is coupled to the first drain, the first source is coupled to a first power rail, and the second source is coupled to a second power rail, thereby defining a series current path from the second power rail, through the first and second transistors, to the first power rail;
   first gate voltage supply means for supplying a first gate voltage to the first gate terminal; and
   second gate voltage supply means for supplying a second gate voltage to the second gate terminal;
   wherein the first and second gate voltage supply means are operatively coupled to the signal input node and responsive to transitions of the input signal between said low and high input levels;
   wherein the first and second gate voltage supply means are further operatively coupled to the transition control node and responsive to the reconvergence control signal;
   wherein the first and second gate supply means are interoperatively coupled such that, for a first state of the reconvergence control signal, one gate supply means keeps its corresponding transistor turned off while the other gate supply means starts to turn its corresponding transistor off in response to the input signal transitioning to one or the other of the low and high levels; and
   wherein the first and second gate supply means are further interoperatively coupled such that, in response to a transition of the reconvergence control signal from the first state to the opposed second state, the one gate supply means begins to turn on its corresponding transistor as the other gate supply means completes the turning off of its corresponding transistor in further response to the input signal transitioning to said one or the other of the low and high levels.

2. The crowbar limited circuit of claim 1
   wherein the first and second gate voltage supply means include respective first and second control voltage developing nodes for developing independently thereat, respective first and second gate control voltages;
   wherein the first and second gate voltage supply means further include respective first and second gate-voltage producing means, coupled to the first and second control voltage developing nodes, for respectively producing the first and second gate voltages in respective response to first and second gate control voltages;
   said crowbar limited circuit further comprising:
   control voltage decoupling and reconvergence means, coupled to the first and second control voltage developing nodes of the first and second gate voltage supply means for interoperatively coupling the first and second gate voltage supply means in response to said reconvergence control signal,
   said control voltage decoupling and reconvergence means having means for decoupling the first and second control voltage developing nodes during a first phase such that the first and second control voltages can develop independently of one another during the first phase and for gradually recoupling the first and second control voltage developing nodes in a second phase following the first phase, thereby to gradually bring the voltages at the first and second control voltage developing nodes into equality with one another during the second phase.

3. A crowbar-limited CMOS circuit comprising:
   a P-type first transistor having respective first gate, source and drain terminals;
   a N-type second transistor having respective second gate, source and drain terminals, where the second drain is coupled to the first drain, the first source is coupled to a first power rail, and the second source is coupled to a second power rail, thereby defining a series current path from the first power rail, through the first and second transistors, to the second power rail;
   first gate voltage supply means for supplying a first gate voltage to the first gate terminal; and
   second gate voltage supply means for supplying a second gate voltage to the second gate terminal;
   where the first and second gate supply means are interoperatively coupled such that one turns its corresponding transistor on while the other turns its corresponding transistor off; and
   wherein the first and second gate supply means are further interoperatively coupled such that the gate voltage of the transistor that is being turned off crosses through a predefined first midpoint level before the gate voltage of the transistor that is being turned on crosses through a similar second midpoint level;
   said crowbar limited circuit further comprising a common input line coupled to the first and second gate voltage supply means and a pre-charge circuit coupled to the common input line, the pre-charge circuit being provided for biasing the voltage of the common input line to a predefined midpoint level.

4. The crowbar limited circuit of claim 3 further comprising a signal source means and a disconnect means coupling the signal source to the common input line, the signal source being provided for driving the common input line from the precharge midpoint level to one of a predefined high (H) or low (L) voltage level when the disconnect means operatively couples it to the common input line.

5. The crowbar limited circuit of claim 2
   wherein the first voltage supply means includes
   first midpoint avoiding means, operatively coupled to the first control voltage developing node, for biasing the voltage of the first control voltage developing node away from a first midpoint control level associated with the first midpoint level of the first transistor; and wherein the second voltage supply means includes second midpoint avoiding means, operatively coupled to the second control voltage developing node, for biasing the voltage of the second control voltage developing node away from a second midpoint control level associated with the second midpoint level of the second transistor.

6. A method for limiting crowbar current in a CMOS circuit having complementary transistors connected in series between first and second power rails, the method comprising the steps of:

turning one transistor off while turning a complementary second transistor on in response to a transition of a supplied input signal; and during the turning on/off operation and independently of the time consumed by the transition of said input signal, causing the transistor that is being turned off to pass through a corresponding midpoint state before the transistor that is being turned on crosses through a similar midpoint state, said midpoint states being such that a hypothetical concurrence of the midpoint states would allow an excessively large crowbar current to flow between the first and second power rails, through the complementary transistors.

7. A method for limiting crowbar current in a CMOS circuit having first and second complementary output transistors connected in series between first and second power rails, where the CMOS circuit is to respond to transitions of a supplied input voltage from below a first threshold level to above a second threshold level or from above the second threshold level to below the first threshold level, the method comprising the steps of:

providing a reconvergence control signal having opposed first and second control states;

providing first and second biasing circuits, the first biasing circuit being for biasing the first output transistor to a non-conductive state in response to the input voltage being below the second threshold level, the second biasing circuit being for biasing the second output transistor to a non-conductive state in response to the input voltage being above the first threshold level;

providing switching means responsive to the reconvergence control signal, the switching means being for selectively driving the second output transistor to a conductive state by way of the first biasing circuit in response to the input voltage being below the second threshold level and in further response to the reconvergence control signal switching from the first to the second control state, and the switching means being further for selectively driving the first output transistor to a conductive state by way of the second biasing circuit in response to the input voltage being above the first threshold level and in further response to the reconvergence control signal switching from the first to the second control state; and switching the reconvergence control signal from the first to the second control state in conformance with movement of said input voltage into a predefined and relatively wide, first high-output impedance voltage range and from there into a predefined and relatively narrower, second high output-impedance voltage range.

8. A method for limiting crowbar current according to claim 7, wherein the input voltage leaves the relatively narrower, second high output-impedance voltage range after moving into it, said method further comprising the step of:

completing the switching of the reconvergence control signal from the first to the second control state just before the input voltage leaves the relatively narrower, second high output-impedance voltage range.

9. A method for limiting crowbar current according to claim 7, wherein the input voltage resides in a low output-impedance range prior to moving into the predefined and relatively wide, first high output-impedance voltage range, said method further comprising the step of:

beginning the switching of the reconvergence control signal from the first to the second control state after the input voltage moves into the predefined and relatively wide, first high output-impedance voltage range.

10. A system for limiting crowbar current in a CMOS circuit having first and second complementary output transistors connected in series between first and second power rails, where the CMOS circuit is to respond to transitions of a supplied input voltage from below a first threshold level to above a second threshold level or from above the second threshold level to below the first threshold level, the system comprising:

a control node for receiving a reconvergence control signal having opposed first and second control states;

first biasing means, operatively coupled to receive the input voltage, for biasing the first output transistor to a non-conductive state in response to the input voltage being below the second threshold level;

second biasing means, operatively coupled to receive the input voltage, for biasing the second output transistor to a non-conductive state in response to the input voltage being above the first threshold level; and switching means, responsive to the reconvergence control signal, for selectively coupling the first biasing circuit to the second output transistor and driving the second output transistor to a conductive state by way of the first biasing circuit in response to the input voltage being below the second threshold level and in further response to the reconvergence control signal switching from the first to the control state, said switching means being further for selectively coupling the second biasing circuit to the first output transistor and driving the first output transistor to a conductive state by way of the second biasing circuit in response to the input voltage being above the first threshold level and in further response to the reconvergence control signal switching from the first to the second control state.

11. A system for limiting crowbar current according to claim 10, further comprising:

a first slew-rate limited amplifier means coupling the first biasing means to the first output transistor; and a second slew-rate limited amplifier means coupling the second biasing means to the second output transistor.

12. A system for limiting crowbar current according to claim 11, wherein current drawn by the first and second slew-rate limited amplifier means during switching it substantially less than a hypothetical crowbar current that would flow through the first and second complementary output transistors during switching if the gates of said first and second complementary output transistors had been hypothetically tied together.

13. A system for limiting crowbar current according to claim 12, wherein said system is incorporated within an integrated circuit package having inductive leads and the slew rates of said first and second slew-rate limited amplifier means are limited to values which limit voltage bounce across said inductive leads to prespecified amounts during switching.

14. The crowbar limited circuit of claim 2, wherein said first and second gate-voltage producing means each includes a CMOS inverter.

15. The crowbar limited circuit of claim 14, wherein said first and second gate-voltage producing means each includes current limiting means for limiting current drawn by the included CMOS inverter to an amount which is substantially less than a hypothetical crowbar current that would flow through the first and second complementary output transistors during switching if the gates of said first and second complementary output transistors had been hypothetically tied together during switching.

16. The crowbar limited circuit of claim 2, wherein said first and second gate-voltage producing means each includes a slew-rate limited amplifier means for coupling an amplified version of the gate control voltage developed at the corresponding control voltage developing node to the gate of the corresponding N-type or P-type transistors at a predefined slew-rate.

17. The crowbar limited circuit of claim 2, wherein said means for decoupling within the voltage decoupling and reconvergence means includes a CMOS transmission gate.

18. A method for operating the crowbar limited circuit of claim 1 comprising the step of:
switching the reconvergence control signal between said opposed first and second states such that, independently of the time consumed by the input signal in switching between the low and high input levels, the gate voltage of the transistor that is being turned off crosses through a predefined first midpoint level before the gate voltage of the transistor that is being kept off and thereafter turned on crosses through a substantially similar second midpoint level, the first and second midpoint levels being such that a hypothetical concurrent application of the first and second midpoint levels respectively to the gates of the first and second transistors would result in the flow of an excessive crowbar current through said series current path.

19. A method in accordance with claim 18 for operating the crowbar limited circuit of claim 1, further comprising the step of:
controlling switching of the reconvergence control signal such that voltages at the gates of the first and second transistors come into substantial convergence with one another at a voltage level that is spaced away from the first and second midpoint levels.

20. A method in accordance with claim 18 for operating the crowbar limited circuit of claim 1, where said first and second midpoint levels are equal or approximately equal to one another and located midway between the voltages of the first power rail and the second power rail.

* * * * *

UNITED STATES PATENT AND TRADEMARK OFFICE
CERTIFICATE OF CORRECTION

PATENT NO. : 5,296,766

DATED : March 22, 1994

INVENTOR(S) : Yoshifumi Masaki

It is certified that error appears in the above-identified patent and that said Letters Patent is hereby corrected as shown below:

```
Column 3, line 49, Insert a period (.) after V_XN.
Column 3, line 50, Insert a period (.) after V_XP.
Column 6, line 7,  Insert a period (.) after "ground".
Column 8, line 3,  Insert a period (.) after M_2.
Column 11, line 62, "81" should be --θ1--.
Column 12, line 22, "θ_2" should be --θ2--;
          line 23, "Vi" should be --V_i-; and after "from" delete
                   "β".
Column 17, line 1,  "it" should be --is--.
           line 11, before "voltage" insert --L(di/dt)--.
           line 33, "transistors" should be --transistor--.
```

Signed and Sealed this

Thirtieth Day of January, 1996

BRUCE LEHMAN

*Attest:*

*Attesting Officer*   *Commissioner of Patents and Trademarks*